(12) United States Patent
Knaus

(10) Patent No.: US 8,466,622 B2
(45) Date of Patent: Jun. 18, 2013

(54) HIGH FREQUENCY POWER SUPPLY

(75) Inventor: Hanns-Joachim Knaus, Emmendingen (DE)

(73) Assignee: Huettinger Elektronik GmbH + Co. KG, Freiburg (DE)

( * ) Notice: Subject to any disclaimer, the term of this patent is extended or adjusted under 35 U.S.C. 154(b) by 1138 days.

(21) Appl. No.: 12/177,809

(22) Filed: Jul. 22, 2008

(65) Prior Publication Data

US 2009/0026964 A1   Jan. 29, 2009

Related U.S. Application Data

(60) Provisional application No. 60/951,392, filed on Jul. 23, 2007.

(30) Foreign Application Priority Data

Dec. 20, 2007   (WO) ................ PCT/EP2007/011264

(51) Int. Cl.
   *H01J 7/24*   (2006.01)
(52) U.S. Cl.
   USPC .................... 315/111.21; 361/84; 361/242
(58) Field of Classification Search
   USPC ......... 315/111.01–111.91; 324/403; 118/696, 118/699, 703, 705, 702, 682; 156/366, 345.28, 156/345.24; 361/84, 242
   See application file for complete search history.

(56) References Cited

U.S. PATENT DOCUMENTS

| | | | |
|---|---|---|---|
| 3,820,008 A | 6/1974 | Guarnaschelli |
| 4,053,848 A | 10/1977 | Kleische |
| 4,215,392 A | 7/1980 | Rhoads |
| 4,490,684 A | 12/1984 | Epsom et al. |
| 4,656,434 A | 4/1987 | Selin |
| 4,701,716 A | 10/1987 | Poole |
| 4,758,941 A | 7/1988 | Felton et al. |
| 4,860,189 A | 8/1989 | Hitchcock |
| 4,910,452 A | 3/1990 | Dickens et al. |
| 4,921,357 A | 5/1990 | Karube et al. |
| 4,980,810 A | 12/1990 | McClanahan et al. |
| 5,195,045 A | 3/1993 | Keane et al. |

(Continued)

FOREIGN PATENT DOCUMENTS

| EP | 0073059 | 3/1983 |
|---|---|---|
| EP | 1 272 014 | 1/2003 |

(Continued)

OTHER PUBLICATIONS

De Vries et al., "Solid State Class DE RF Power Source", Proc. IEEE International Symposium on Industrial Electronics (ISIE'98), vol. 2, pp. 524-529, Pretoria, South Africa, Jul. 1988.

(Continued)

*Primary Examiner* — Jimmy Vu
*Assistant Examiner* — Henry Luong
(74) *Attorney, Agent, or Firm* — Fish & Richardson P.C.

(57) ABSTRACT

For determining a wave running time between a RF source in a plasma power supply device and a load connected to the plasma power supply device, an RF pulse is transmitted forwards from the RF source to the load. The pulses are reflected by the load and transmitted backwards to the power source. A return time measured on arrival of the pulse(s) at the inverter is used to determine a wave running time.

27 Claims, 2 Drawing Sheets

U.S. PATENT DOCUMENTS

| | | |
|---|---|---|
| 5,222,246 A | 6/1993 | Wolkstein |
| 5,225,687 A | 7/1993 | Jason |
| 5,363,020 A | 11/1994 | Chen et al. |
| 5,382,344 A | 1/1995 | Hosokawa et al. |
| 5,394,061 A | 2/1995 | Fujii |
| 5,424,691 A | 6/1995 | Sadinsky |
| 5,434,527 A | 7/1995 | Antone |
| 5,435,881 A | 7/1995 | Ogle |
| 5,438,498 A | 8/1995 | Ingemi |
| 5,523,955 A | 6/1996 | Heckman |
| 5,563,775 A | 10/1996 | Kammiller |
| 5,574,410 A | 11/1996 | Collins et al. |
| 5,610,452 A | 3/1997 | Shimer et al. |
| 5,635,762 A | 6/1997 | Gamand |
| 5,810,963 A | 9/1998 | Tomioka |
| 5,875,103 A | 2/1999 | Bhagwat et al. |
| 5,944,942 A | 8/1999 | Ogle |
| 6,038,142 A | 3/2000 | Fraidlin et al. |
| 6,084,787 A | 7/2000 | Nyberg et al. |
| 6,130,831 A | 10/2000 | Matsunaga |
| 6,229,718 B1 | 5/2001 | Nilssen |
| 6,246,599 B1 | 6/2001 | Jang et al. |
| 6,297,696 B1 | 10/2001 | Abdollahian et al. |
| 6,313,584 B1 * | 11/2001 | Johnson et al. .......... 315/111.21 |
| 6,344,768 B1 | 2/2002 | Daun-Lindberg et al. |
| 6,365,868 B1 | 4/2002 | Borowy et al. |
| 6,703,080 B2 | 3/2004 | Reyzelman et al. |
| 6,704,203 B2 | 3/2004 | Chapuis et al. |
| 6,760,234 B2 | 7/2004 | Yuzurihara et al. |
| 6,777,881 B2 | 8/2004 | Yuzurihara et al. |
| 6,791,851 B2 | 9/2004 | Brkovic |
| 6,909,617 B1 | 6/2005 | Mirskiy |
| 6,992,902 B2 | 1/2006 | Jang et al. |
| 6,996,892 B1 | 2/2006 | Denning et al. |
| 7,138,861 B2 | 11/2006 | Sundström et al. |
| 7,161,818 B2 | 1/2007 | Kirchmeier et al. |
| 7,244,343 B2 | 7/2007 | Watanabe et al. |
| 7,259,623 B2 | 8/2007 | Coleman |
| 7,312,584 B2 | 12/2007 | Tamita et al. |
| 7,333,348 B2 | 2/2008 | Horiuchi et al. |
| 7,353,771 B2 | 4/2008 | Millner et al. |
| 7,403,400 B2 * | 7/2008 | Stanley ............................ 363/16 |
| 7,452,443 B2 * | 11/2008 | Gluck et al. ............. 156/345.35 |
| 7,616,462 B2 | 11/2009 | Millner et al. |
| 7,755,300 B2 | 7/2010 | Kishinevsky et al. |
| 7,796,005 B2 | 9/2010 | Blankenship et al. |
| 7,872,523 B2 | 1/2011 | Sivakumar et al. |
| 7,884,590 B2 | 2/2011 | Liu |
| 2003/0215373 A1 * | 11/2003 | Reyzelman et al. ..... 422/186.29 |
| 2004/0031566 A1 | 2/2004 | Takahashi et al. |
| 2004/0105288 A1 | 6/2004 | Watanabe et al. |
| 2004/0114399 A1 | 6/2004 | Lincoln et al. |
| 2005/0088231 A1 | 4/2005 | Ziegler |
| 2005/0088855 A1 | 4/2005 | Kirchmeier et al. |
| 2005/0122087 A1 | 6/2005 | Sakai et al. |
| 2005/0255809 A1 | 11/2005 | Glueck |
| 2006/0158911 A1 | 7/2006 | Lincoln et al. |
| 2006/0191880 A1 | 8/2006 | Kwon et al. |
| 2006/0196426 A1 | 9/2006 | Gluck et al. |
| 2006/0252283 A1 | 11/2006 | Takeda et al. |
| 2007/0121267 A1 * | 5/2007 | Kotani et al. ................... 361/85 |
| 2007/0145900 A1 * | 6/2007 | Kirchmeier et al. ..... 315/111.21 |
| 2009/0153127 A1 | 6/2009 | Chen |

FOREIGN PATENT DOCUMENTS

| | | |
|---|---|---|
| EP | 1783904 | 10/2005 |
| EP | 1 701 376 | 9/2006 |
| EP | 1701376 | 9/2006 |
| EP | 1 783 904 | 5/2007 |
| JP | 55082967 | 6/1980 |
| JP | 9120910 A | 5/1997 |
| JP | 10214698 A | 8/1998 |
| JP | 2001185443 A | 7/2001 |
| JP | 2002237419 A | 8/2002 |
| JP | 2005086622 A | 3/2005 |
| JP | 2006165438 A | 6/2006 |
| WO | 9749267 | 12/1997 |
| WO | 9857406 | 12/1998 |
| WO | 2005094138 | 6/2005 |

OTHER PUBLICATIONS

Walker et al., "An Isolated MOSFET Gate Driver". Australasian Universities Power Engineering Conference, AUPEC'96, 1996, vol. 1, Melbourne, pp. 175-180.

International Search Report from corresponding PCT Application No. PCT/EP2007/011264, mailed May 23, 2008, 11 pages.

* cited by examiner

HIGH FREQUENCY POWER SUPPLY

CROSS REFERENCE TO RELATED APPLICATIONS

This application claims priority under 35 U.S.C. §119(e) to U.S. Patent No. 60/951,392, filed on Jul. 23, 2007 and under 35 U.S.C. §119(a) to PCT/EP2007/011264, filed on Dec. 20, 2007. Both of these priority applications are hereby incorporated by reference in their entirety.

TECHNICAL FIELD

The invention relates to a plasma power supply device for generating an output power greater than about 500 W at an essentially constant basic frequency greater than about 3 MHz for a plasma process. In particular, the invention relates to determining the wave running time between at least one inverter in a plasma power supply device, which has at least one switching element, and a load connected to the plasma power supply device.

BACKGROUND

An exemplary plasma power supply device is disclosed in U.S. Publication No. 2007/0121267 A1.

SUMMARY

A plasma power supply device provides an output power greater than 500 W at an essentially constant basic frequency of at least 3 MHz to a plasma process. A fraction of the output power can be reflected from the plasma process at least in the event of a mismatch.

In one aspect, a method for determining a wave running time between a plasma power supply device and a load connected to the plasma power supply device includes transmitting at least one radio frequency (RF) pulse forward from the plasma power supply device to the load, and starting a time measurement at a start time that relates to the transmittal of the at least one RF pulse, measuring a return time on arrival of the pulse reflected by the load and transmitted backward to the plasma power supply device, and determining the wave running time based on the start time and the return time.

In another aspect, a plasma supply device for generating an output power greater than 500 W at an essentially constant basic frequency of at least 3 MHz and for powering a plasma process to which the output power is supplied and from which reflected power is returned to the plasma power supply device, at least in the event of an impedance mismatch between the plasma power device and its load, the load including an impedance of the plasma process in operation, includes a RF source configured for supplying the output power and for supplying a measurement signal to the load, a control system for activating the RF source, and a time measurement device between the RF source and the load for measuring a return time of the measurement signal being reflected from the load, wherein the control system is configured to activate the inverter for supplying the measurement signal, to start a time measurement of the time measurement device at a start time, to end the time measurement at a return time, when the measurement signal returns to the time measurement device, and to derive a wave running time of the measurement signal between the plasma power supply device based on the start time and the return time.

In some embodiments, the start time can, e.g., coincide with the transmittal of the RF pulse. Alternatively, the start time can be determined by measuring a time at which the RF pulse passes the same or another time measurement device when traveling to the load.

Some embodiments provide the possibility to determine the wave running time between the inverters of a RF source and the load to be supplied in a plasma power supply device, thereby largely avoiding intervention in the circuit structure.

In another aspect, a method for determining the wave running time between at least one inverter in a plasma power supply device that has at least one switching element and a load connected to the plasma power supply device, where at least one RF pulse running in a forward direction from the inverter to the load is started together with a time measurement, and where the time measured at the inverter, on arrival of the pulse reflected by the load and running backward towards the inverter, is stored.

Implementations can include one or more of the following features.

The measured time can be suitably stored in a control system. The wave running time can be typically determined at a load that has not yet been matched, e.g., before the proper power supply of the load by the plasma power supply device. Proper power supply of the load means that the power required for the intentional ignition and maintenance of a plasma process is discharged to the load. If the wave running time can be determined before the proper power supply of a plasma process, or before the proper power discharge to the plasma process, for example, immediately after the plasma power supply device is switched on, the plasma is normally not yet ignited and consequently there is a major mismatch. Thus, most of the RF power supplied to the plasma chamber, in which the plasma is to be ignited, is reflected back to the inverter.

Furthermore, the wave running time can be determined from a plurality of RF pulses transmitted one after the other to the load and reflected by it. In this case, a sequence of a plurality of RF pulse is transmitted instead of a single RF pulse. This can avoid incorrect measurements and the wave running time can be determined more accurately. The sequence of RF pulses can also be coded, e.g., provided with a wave pattern, to ensure higher reliability in measuring the reflected RF pulses. A plurality of pulses or pulse sequences transmitted forward to the load can be increased in power, starting from low power values, until a reliable detection of the pulses returning from the load takes place in the measurement of the reflected power. A plurality of pulses or pulse sequences can be repeated until a sufficient degree of certainty that the correct wave running time has been determined is obtained.

In another aspect, a plasma power supply device that has at least one inverter with at least one switching element, a control system for activating the at least one inverter, and a memory for storing at least one measured time, wherein the control system activates the at least one inverter for supplying at least one RF pulse and/or a sequence of a plurality of RF pulses running to the load, at the same time starts a time measurement and, when the pulse or pulses reflected by the load arrive/s at the inverter, ends the time measurement and stores the measured time in the memory. The control system itself can be the memory for storing the at least one measured time or can have such a memory.

In some embodiments of the plasma power supply device, the at least one switching element can be a MOSFET. An inverter with at least one switching element, in particular a class D amplifier with half or full bridges constructed from MOSFETs, can be used to process reflected power without being damaged, provided that the switching elements are switched off permanently or for most of the time the reflected RF power is applied. "Switched off" corresponds to a "proper non-conducting condition," e.g., a condition in which the transistors are activated/driven so that they do not conduct. Then, the transistors are switched to a high resistance condition. This definition takes account of the fact that MOSFETs have a body diode and can also be conducting when switched off.

When switched off, the power arriving at the inverter can only flow via body diodes into the DC supply to which the inverter is connected. The MOSFETs behave similarly to capacitors and reflect for their part most of the power reflected from the mismatched load, the body diodes determining a maximum voltage limit. At the high basic frequency at which the plasma power supply device is operated, the body diodes store for the most part the charge carriers flowing in the forward direction and discharge most of them again when the direction of flow is reversed. The power that can be again reflected from the inverter or from the switching elements can be discharged into an absorptive component.

The at least one inverter can be configured as a push-pull stage. Furthermore, the at least one inverter can have a single switching element. The at least one inverter can have at least two switching elements in a half bridge arrangement or at least four switching elements in a full bridge arrangement. The at least one inverter can be a class D amplifier or a class E amplifier.

In some embodiments, the plasma power supply device can include a plurality, preferably two power supply modules each with at least one inverter, The modules can be coupled together by means of at least one power coupler, where the at least one power coupler conducts the power transmitted from the power supply modules to the load, depending on the phase, to a first or a second port assigned to the power supply of the plasma process.

The plasma power supply device can have at least one absorptive component, which at least partially absorbs power reflected from the plasma process, e.g., at the basic frequency. For example, the at least one absorptive component can be connected to a second output gate of the at least one power coupler. The at least one absorptive component can be an absorptive resistor. The power, which is emitted at the first output port of the power coupler, can be conducted in the direction of the load or to further power couplers. The power emitted at the second output port can be absorbed for the most part in the absorptive component. Alternatively, the power can be rectified at the second output port and returned to the DC supply. In addition, or alternatively, an absorptive component can be assigned to every second output port in the case of a plurality of power couplers.

The at least one power coupler can be a 90° hybrid that serves as a power coupler or combiner for the waves coming from the power supply modules as a power coupler or combiner, and that serves as a splitter for the wave returning from the load to the power supply modules. To constructively superimpose the RF powers coming from the power supply modules in the 90° hybrid, the power supply modules, e.g., the inverters of the power supply modules, should be activated so that they emit wave trains offset by $-\pi/2$.

The RF power reflected from the load due to impedance mismatching can be halved and transmitted to the power supply modules with the inverters with a $\pi/2$ phase shift. The capacitive behavior of the switching elements, when switched off, can give rise to an almost complete reflection of the wave arriving at the inverter, so that the RF power again flows forwards in the direction of the power coupler. Because of the further equally acting $\pi/2$ phase shift in the 90° hybrid and in comparison to the generating condition, the wave sequences have a phase shift of $\pi$, resulting in an exchange of the functionality of the first and second ports so that the wave reflected by the inverters can be conducted not to the load but via the second port to the absorptive component.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference symbols in the various drawings indicate like elements.

DETAILED DESCRIPTION

Figure 1:
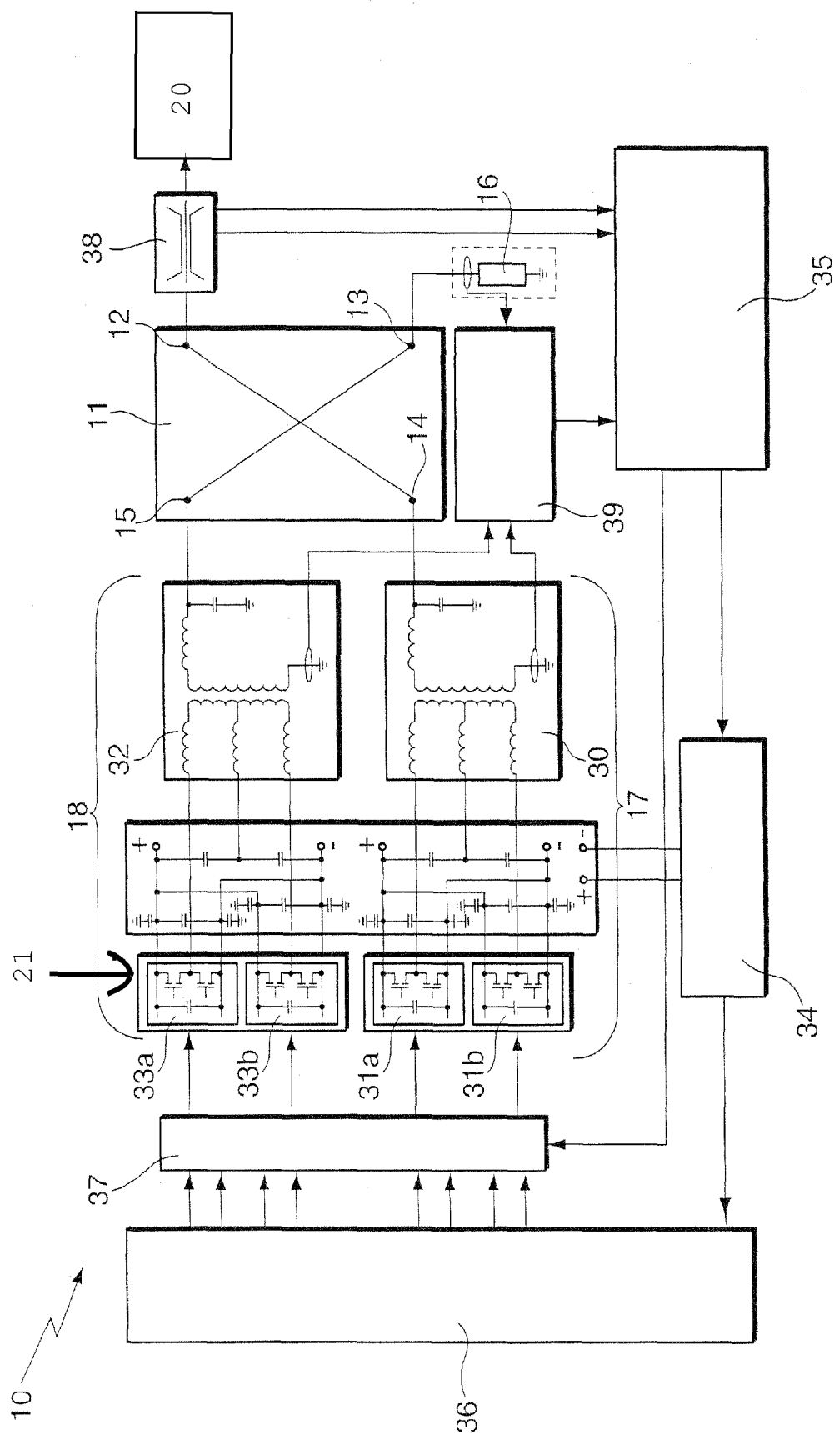
FIG. 1 is a block diagram of an exemplary plasma power supply device.

FIG. 1 illustrates the circuit structure of a plasma power supply device 10 with a radio frequency (RF) source, a power coupler 11, and a time measurement device 38.

The RF source includes inventors 31a, 31b, 33a, 33b, which each include two switching elements 21, e.g., MOSFET transistors. The inverters 31a, 31b, 33a, and 33b are connected to a DC power supply 34 and are activated individually by a control system 35 and a signal transformer 37, which is connected to a gate voltage generator 36. For example, during plasma processing, the RF source provides output power (RF power, for example, high frequency power), which ignites and maintains the plasma process.

The power coupler 11 can be configured as a 90° hybrid or as a 3-dB coupler, and has a first output port 12, a second output port 13, a first input port 14, and a second input port 15. A load 20, in particular, a plasma load, is connected to first output port 12. An absorptive component 16, e.g., a resistor, is connected to the second output port 13. The first input port 14 and the second input port 15 serve as input ports for a first power supply module 17 and a second power supply module 18, respectively. The power supply modules 17 and 18 include a first output network 30 and first inverters 31a and 31b, and a second output network 32 and second inverters 33a and 33b, respectively.

The measuring device 38 is arranged between the first output port 12 of the power coupler 11 and the load 20. The measuring device 38 measures or determines, for example, points in time and associated time intervals of emitted or returning RF signals, the output power transferred to the load and the power reflected by the load 20.

The measured values determined by the measuring device 38 are transmitted to the control system 35, which compares the measured values with a reference value. Depending on the result of the comparison or the wave running time determined, the inverters 31a, 31b, 33a, and 33b or their switching elements 21 are activated so that they either generate a high RF power or remain permanently on for most of the RF period in the switched off condition. Thus, based on the measured values one can adapt the operation, e.g., the rate at which power is supplied to the plasma process, to changes in, e.g., the length of the cable or other electrical components on the connection between the plasma chamber and the power supply. In addition, current measurement values of a current measuring device 39 measured at the output networks 30 and 32 and/or at the absorptive component 16 are also transmitted to the control system 35.

Figure 2:
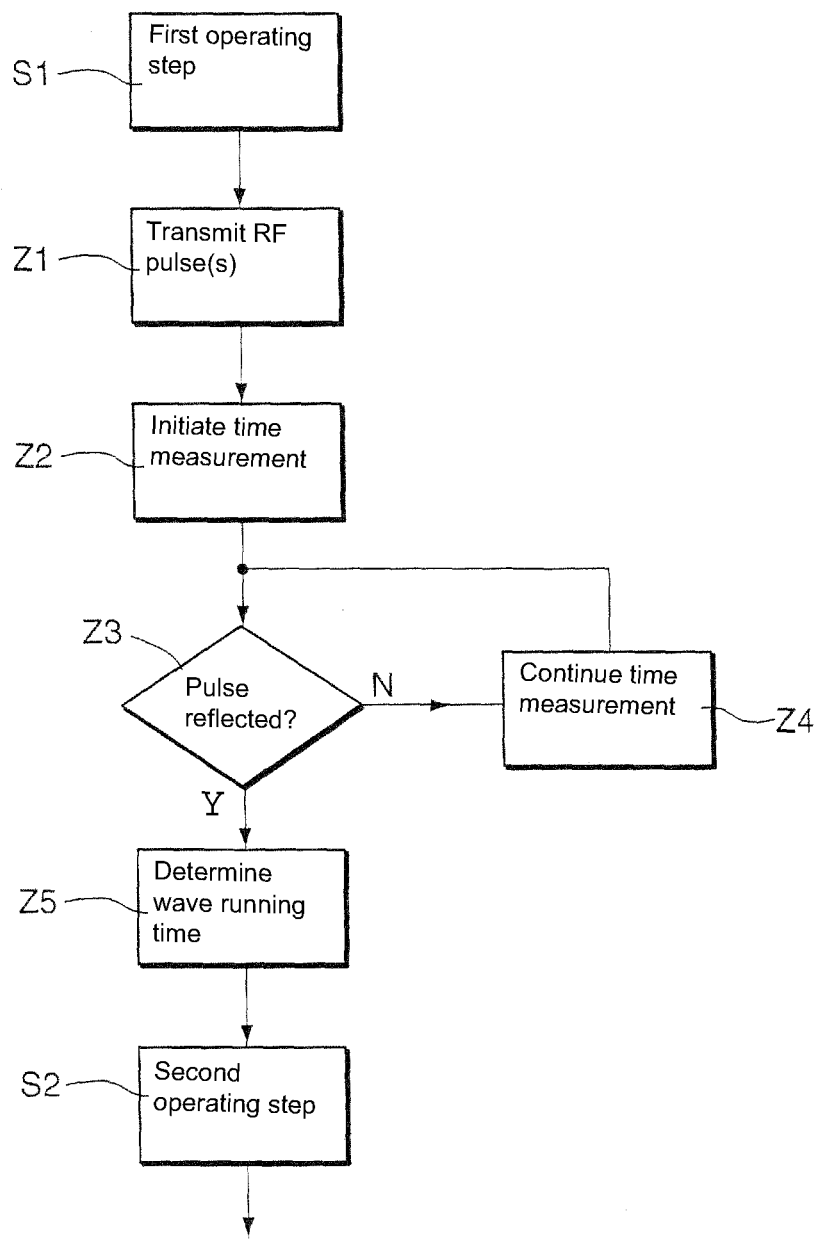
FIG. 2 is a flow chart of a procedure for determining the wave running time between at least one inverter in a plasma power supply device and a load.

FIG. 2 illustrates, in a flow chart, general steps for determining a wave running time, e.g., the time period during which a signal (RF wave) travels from at least one of the inverters 31a, 31b, 33a, 33b to the load 20 and back to the inverter. A total of five steps Z1-Z5 are performed between a first operating step S1, e.g., the switching on of a plasma power supply device or a DC power supply, and a second operating step S2, e.g., a first activation of the at least one inverter for the proper power supply of the load.

Following the first operating step S1, an RF pulse or sequence of RF pulses is transmitted forward from, e.g., one of the inverters 31a, 31b, 33a, 33b to the load 20 (step Z1). At the same time, a time measurement is initiated (step Z2). Then an inquiry is performed that checks whether a pulse reflected from the load 20 back to the respective inverter has been detected, e.g., has arrived at the inverter (step Z3). If the reflected pulse is not detected (N), the time measurement continues (step Z4), which is followed by a follow-up inquiry (repeated step Z3).

As soon as a pulse reflected by the load and returning to the respective inverter is detected (Y), the measured point in time, which corresponds to the return time, is used to determine the wave running time (step Z5). Any of the involved parameters can also be stored or compared to predefined or predetermined values. Considering the determined wave running time, the second operating step S2 is performed, e.g., the activation of the at least one inverter for supplying power to the load 20.

To determine the wave running time with the circuit structure of FIG. 1 as illustrated in the flowchart of FIG. 2, the control system 35 activates the inverters 31a, 31b, 33a, and 33b through the signal transformer 37, so that the inverters each generate an initial RF pulse. At the time of the activation, the time measurement can be initiated by the control system 35. Then the time of activation is assigned as start time of the measurement. The RF pulses generated by the power supply modules 17 and 18 are combined in the power coupler 11 to form a measurement RF pulse, which is transmitted at the first output port 12 in the direction of the load 20. The start time, (the time of generation of the RF pulse transmitted to the load 20) and the time of return of a pulse reflected by the load 20 are recorded by the measuring device 38, and corresponding signals are evaluated by the control system 35.

In addition or alternatively, one can measured a pass time corresponding to the detection of the RF pulse at the first port 12 with the measuring device 38, when the RF pulse is on its way to the load 20. Then, one can assign the pass time as the start time of the time measurement.

The time measurement ends with the arrival of the pulse reflected by the load 20 at the measuring device 38.

Based on the two differently assigned start times, one can determine as the wave running time the time interval during which the measurement signals travels from the time measurement device 38 to the load 20 and back to the time measurement device 38, or one can determine as the wave running time the time interval during which the measurement signals travels from the switching element to the load 20 and back to the time measurement device 38. The later can be also considered to be a total wave running time.

The total wave running time can also determined from the time interval during which the measurement signals travels from the time measurement device 38 to the load 20 and back and from a predetermined or measured time period that is associated with the running time of the measurement signal within the power supply from the switching element to the time measurement device 38. For example, one can determine the total wave running time from the wave running time between the measuring device 38 and the load 20 and back, and from twice the time period between activation of inverters 31a, 31b, 33a, and 33b and the detection of the RF pulse discharged at the first port 12 of the power coupler 11 in the measuring device 38.

Alternatively, one can determine the wave running time from the part of the wave running time between the invertors and the load and back to the measurement device (time period between the start time and the return time) and the time period between activation of inverters 31a, 31b, 33a, and 33b and the detection of the RF pulse discharged at the first port 12 of the power coupler 11 in the measuring device 38.

The time period between activation of inverters 31a, 31b, 33a, and 33b and the detection of the RF pulse discharged at the first port 12 of the power coupler 11 in the measuring device 38 is usually unchanged and can also be provided to the determination of the wave running time as a stored parameter.

A number of embodiments of the invention have been described. Nevertheless, it will be understood that various modifications may be made without departing from the spirit and scope of the invention. For example, FIG. 1 illustrates a power supply with a hybrid coupler. However, the wave running can be used in various power supply configuration. For example, a power supply (without a coupler) can also benefit from the knowledge of the cable length, e.g., to adjust stored impedance matching parameters or to initiate a new matching cycle upon change of the cable length. In addition, even though the load is connected directly to the hybrid in FIG. 1, there can be an impedance matching network between the inverter and the plasma load. Accordingly, other embodiments are within the scope of the following claims.

What is claimed is:

1. A method performed by a plasma power supply device for determining a wave running time between the plasma power supply device and a load connected to the plasma power supply device, the method comprising:
   transmitting at least one RF pulse forward from the plasma power supply device to the load;
   starting a time measurement at a start time that relates to the transmittal of the at least one RF pulse;
   measuring a return time on arrival of the pulse reflected by the load and transmitted backward to the plasma power supply device; and
   determining the wave running time based on the start time and the return time.

2. The method of claim 1, wherein the plasma power supply device includes at least one inverter with a switching element, and the start time is the time at which the switching element is switched to generate the at least one RF pulse.

3. The method of claim 1, wherein the plasma power supply device includes at least one inverter and a time measurement device between the at least one inverter and the load, and the start time is the time at which the at least one RF pulse passes by the time measurement device.

4. The method of claim 1, wherein the wave running time is determined from a sequence of a plurality of RF pulses transmitted consecutively to the load and reflected by the load.

5. The method of claim 1, wherein the wave running time is determined from at least one of a plurality of individual RF pulses and sequences of RF pulses transmitted consecutively to the load and reflected by the load.

6. The method of claim 5, wherein at least one of the RF pulses or the sequences of RF pulses are increased in power, starting with low power values.

7. The method of claim 1, further comprising supplying proper power to the load by the plasma power supply device, wherein the return time measurement takes place before the supplying proper power to the load.

8. The method of claim 1, further comprising after measuring the return time of the pulse reflected by the load, discharging the pulse reflected by the load into an absorptive component.

9. The method of claim 1, further comprising adjusting an operating parameter of the plasma power supply device based on the wave running time.

10. The method of claim 9, wherein the operating parameter is a time interval during which the plasma power supply device is disconnected from the load.

11. The method of claim 1, further comprising adjusting a matching parameter, the matching parameter affecting an impedance matching of the load to the plasma power supply device.

12. The method of claim 1, further comprising storing at least one of the start time, the return time, and the wave running time.

13. A plasma power supply device for generating an output power greater than 500 W at an essentially constant basic frequency of at least 3 MHz and for powering a load to which the output power is supplied and from which reflected power is returned to the plasma power supply device, at least in the event of an impedance mismatch between the plasma power supply device and the load, the load including an impedance of the plasma process in operation, the plasma power supply device comprising:
  an RF source configured for supplying the output power and for supplying a measurement signal to the load;
  a control system for activating the RF source; and
  a time measurement device between the RF source and the load for measuring a return time of the measurement signal being reflected from the load,
wherein the control system is configured to:
  activate an inverter for supplying the measurement signal,
  start a time measurement of the time measurement device at a start time that relates to the activation of the inverter for supplying the measurement signal,
  end the time measurement at a return time, when the measurement signal returns to the time measurement device, and
  derive a wave running time of the measurement signal between the plasma power supply device based on the start time and the return time.

14. The plasma power supply device of claim 13, wherein the measurement device is further configured to measure a passing time of the measurement signal when traveling towards the load, and the control system is further configured to use the passing time as the start time.

15. The plasma power supply device of claim 13, wherein the control system is further configured to use the time of activation of the RF source as the start time.

16. The plasma power supply device of claim 13, further comprising a memory for storing at least one of the start time, the return time, and the wave running time.

17. The plasma power supply device of claim 13, wherein the power source includes at least one switching element that includes a MOSFET.

18. The plasma power supply device of claim 13, wherein the RF source includes at least two switching elements in a half bridge arrangement.

19. The plasma power supply device of claim 13, wherein the RF source includes at least four switching elements in a full bridge arrangement.

20. The plasma power supply device of claim 13, wherein the RF source includes an inverter that is one of a class D amplifier and a class E amplifier.

21. The plasma power supply device of claim 13, further including at least one absorptive component, which is configured to at least partially absorb power reflected from the plasma process.

22. The plasma power supply device of claim 13, wherein the RF source comprises at least a first power supply module and a second power supply module, each power supply module including at least one inverter with at least one switching element, a power coupler with at least a first input port, a second input port, a first output port, and second output port,
  wherein the first and second power supply modules are coupled to the first input port and the second input port of the power coupler for supplying a first input signal and a second input signal, respectively, the first input signal and the second input signal having a phase relationship, the first output port is coupled to the load, and the power coupler is configured to combine the first input signal and the second input signal in a combined signal, which is provided in dependence of the phase relationship to at least one of the first output port and the second output port.

23. The plasma power supply device of claim 22, wherein at least one absorptive component is connected to the second output port of the power coupler.

24. The plasma power supply device of claim 23, wherein the at least one absorptive component is a resistor.

25. The plasma power supply device of claim 22, wherein the at least one power coupler is a 90° hybrid.

26. The plasma power supply device of claim 13, wherein the wave running time is a time interval during which the measurement signal travels from the time measurement device to the load and back.

27. The plasma power supply device of claim 13, wherein the RF source includes a switching element, and the wave running time is a time interval during which the measurement signals travels from the switching element to the load and back to the time measurement device.

* * * * *